United States Patent [19]

Danilatos et al.

[11] Patent Number: 4,823,006

[45] Date of Patent: Apr. 18, 1989

[54] INTEGRATED ELECTRON OPTICAL/DIFFERENTIAL PUMPING/IMAGING SIGNAL DETECTION SYSTEM FOR AN ENVIRONMENTAL SCANNING ELECTRON MICROSCOPE

[75] Inventors: Gerasimos D. Danilatos, North Bondi, Australia; George C. Lewis, Sudbury, Mass.

[73] Assignee: ElectroScan Corporation, Danvers, Mass.

[21] Appl. No.: 158,208

[22] Filed: Feb. 19, 1988

Related U.S. Application Data

[63] Continuation-in-part of Ser. No. 52,700, May 21, 1987.

[51] Int. Cl.[4] .......................................... H01J 37/252
[52] U.S. Cl. ............................. 250/310; 250/441.1; 250/396 ML
[58] Field of Search ............ 250/310, 306, 307, 441.1, 250/396 ML; 219/121.24

[56] References Cited

U.S. PATENT DOCUMENTS

Re. 27,005 12/1970 Wingfield et al. .................. 250/310

OTHER PUBLICATIONS

Danilatos et al., *Scanning*, vol. 2, No. 2, 1979, pp. 72-82.
Danilatos, G. D., "ESEM—A Multipurpose Surface Electron Microscope," G. W. Bailey, Ed. Proceedings of the 44th Annular Meeting of the Electron Microscopy Society of America, pp. 632-633 (1986).
Danilatos, "A Gaseous Detector Device for an Environmental SEM", *Micron and Microscopa Acta 14 (4)*, pp. 307-318 (1983).
Danilatos, "Design and Construction of an Atmospheric or Environmetnal SEC", (Part 3), *Scanning*, vol. 7, 26-42 (1985).
Danilatos, G. D., "Improvements on the Gaseous Detector Device," G. D. Bailey, Ed. *Proceedings of the 44th Annular Meeting of the Electron Microscopy of America*, pp. 630-631 (1986).

*Primary Examiner*—Jack I. Berman
*Attorney, Agent, or Firm*—Curtis, Morris & Safford

[57] ABSTRACT

This invention provides for an integrated electron optical/differential pumping/imaging signal detection system for an environmental scanning electron microscope (ESEM). The ESEM includes a substantially cylindrical objective lens magnetic housing containing an axially disposed vacuum liner tube and containing means for magnetically focusing a beam of electrons passing through said liner tube. An annular ring comprised of magnetic materials abuts said magnetic housing at the lower end thereof and contains at least two pumping ports therein located axially with respect to one another. At least two annular nonmagnetic diaphragms and a final magnetic annular diaphragm are attached to the annular ring at different axial locations and extending inwardly therefrom. The diaphragms define at least two interior passages which each communicate with one of the pumping ports formed in the annular ring. A combination aperture holder and electron detector is releasably received and sealed with in the central openings of the annular diaphragms. The aperture holder has apertures therein for the passage of the electron beam and gas into and out of the specimen chamber of the ESEM and the interior passages and has electron detector means associated with the lower portion thereof.

23 Claims, 4 Drawing Sheets

FIG.I
PRIOR ART

INTEGRATED ELECTRON OPTICAL/DIFFERENTIAL PUMPING/IMAGING SIGNAL DETECTION SYSTEM FOR AN ENVIRONMENTAL SCANNING ELECTRON MICROSCOPE

BACKGROUND OF THE INVENTION

This application is a continuation-in-part of U.S. patent application Ser. No. 052,700 entitled Secondary Electron Detector for Use in a Gaseous Atmosphere, filed May 21, 1987.

This invention relates to the field of environmental scanning electron microscopes (ESEM), and more particularly, to an integrated electron optical/differential pumping/imaging signal detection system for an environmental scanning electron microscope.

As background, the advantages of the ESEM over the standard scanning electron microscope (SEM) lie in its ability to produce high-resolution electron images of moist or nonconductive specimens (e.g., biological materials, plastics, ceramics, fibers) which are extremely difficult to image in the usual vacuum environment of the SEM. The ESEM allows the specimen to be maintained in its "natural" state, without subjecting it to the distortions caused by drying, freezing, or vacuum coating normally required for high-vacuum electron beam observation. Also, the relatively high gas pressure easily tolerated in the ESEM specimen chamber acts effectively to dissipate the surface charge that would normally build up on a nonconductive specimen, blocking high quality image acquisition. The ESEM also permits direct, real-time observation of liquid transport, chemical reaction, solution, hydration, crystallization, and other processes occurring at relatively high vapor pressures, far above those that can be permitted in the normal SEM specimen chamber.

This technological advance in imaging capability opens a previously hidden world of microscopic phenomena to investigators in a wide spectrum of disciplines, including, but not limited to, medicine, biology, food and drug technology, geology, composite materials, textiles, semiconductors and forensics, in short, any field involving specimens which are difficult to image with the standard SEM. Previously thought impractical (if not impossible), the electron beam observation of unprepared, full-sized specimens at high vapor pressures is made possible by this invention, which combines pressure control and signal detection means, housed entirely within the magnetic objective lens of the ESEM electron beam column. This electromechanical design satisfies the simultaneous requirements for pressure control, electron beam focusing, and signal amplification, while placing no practical limitations on specimen handling or microscopic resolving power.

OBJECTS OF THE INVENTION

It is a general object of this invention to provide an improved environmental scanning electron microscope.

It is also an object of the invention to provide an improved environmental scanning electron microscope which permits direct, real-time observation of liquid transfer, chemical reactions, solutions, hydration, crystallization, and other processes occurring at relatively high vapor pressures.

It a further object of the invention to provide an improved environmental scanning electron microscope wherein the pressure control and signal detection means are housed entirely within the magnetic objective lens of the ESEM electron beam column.

It is a further object of the invention to provide an improved environmental scanning electron microscope which increases signal collection efficiency and performance and reduces the working distance thereby providing better resolution of the specimen.

It is another object of this invention to provide an environmental scanning electron microscope which satisfies the simultaneous requirements for pressure control, electron beam focusing, and signal amplification while placing no practical limitations on specimen handling or microscope resolving power.

It is still a further object of this invention to provide an environmental scanning electron microscope wherein the pressure control and signal detection means are combined and entirely housed within the magnetic objective lens of the ESEM electron beam column.

It is yet another object of the invention to provide an environmental scanning electron microscope wherein the detector is formed integrally with a pressure-limiting aperture contained within the objective lens assembly, thereby allowing use of high pressures around the specimen.

It is a still further object of the invention to provide an improved environmental scanning electron microscope wherein the electron detector is formed integrally with a pressure-limiting aperture and, as such, the plate detectors do not compete for space with the back-scatter detectors.

It is still a further object of the invention to provide an improved environmental scanning electron microscope wherein a single-stage electron detector is formed integrally with a pressure-limiting aperture, the detector having the ability to image with either the back scatter or environmental secondary detector without changing the mechanical configuration of the machine.

Other objects and advantages of the invention will become apparent from the detailed description and from the appended drawings in which like numbers have been used to designate like parts in the several views.

SUMMARY OF THE INVENTION

This invention relates generally to an improved environmental scanning electron microscope, and more particularly to an integrated electron optical/differential pumping/imaging signal detection system for an environmental scanning electron microscope.

In a preferred embodiment, the electron microscope includes an electron gun for generating and directing an electron beam toward a specimen to be examined. The vacuum system of the electron microscope includes two major components: namely, an electron optical column and a specimen chamber. The electron optical column includes an objective lens assembly. The objective lens assembly includes a means for focusing a beam of electrons and means for scanning the surface of a specimen with the focused beam of electrons which is capable of scanning an electron beam emitted by the electron gun across the diameter of the final pressure-limiting aperture. The specimen chamber is disposed below the electron optical column and is capable of maintaining a sample enveloped in gas in registration with the final pressure-limiting aperture such that a surface of the specimen may be exposed to the focused beam of electrons.

The pressure control of this ESEM is integrated into the objective lens assembly. The column vacuum liner tube terminates at its lower end in the first of two "intermediate" vacuum chambers or interior passages, defined by two nonmagnetic diaphragms and a final magnetic lens pole piece. The vacuum chambers are both entirely contained within and sealed against the objective lens magnetic housing, which has been specially perforated with a plurality of radially aligned ports connecting each chamber to its external pumping system. The electron beam, passing down the center of the optical column tube, traverses the two vacuum chambers before striking the specimen surface, which is immersed in the specimen chamber environment. The beam passes through two pressure-limiting apertures, both held in alignment within a removable aperture carrier. In contrast to a normal SEM specimen chamber, which must be maintained at a vacuum pressure of 0.0001 Torr or lower, this ESEM is capable of supporting specimen chamber pressures of over 20 Torr (the saturated partial pressure of water vapor at room temperature) with no significant degradation of vacuum levels in the upper column region.

In addition, the secondary electron imaging detector is formed integrally with the aperture carrier. The entire assembly of the integral aperture carrier and electron detector is threaded into a nonmagnetic bushing, attached to the magnetic objective lens pole piece. When fully turned in, the aperture carrier seals both against the pole piece and the lower diaphragm of the differential pumping system, and both pressure-limiting apertures are simultaneously installed in their proper locations. The upper pressure-limiting aperture of the aperture carrier receives the primary beam from the upper vacuum chamber, while the integral lower aperture and detector plate faces the specimen under study. The main body of the aperture carrier is relieved with several openings so that the region between the apertures is well exposed to the pressure level of the lower intermediate vacuum chambers. While the upper aperture may be machined directly into the aperture carrier, the lower aperture must be mounted in an insulating bushing to isolate the detector electrically from the grounded lens pole piece.

The secondary electrons issuing from the specimen are accelerated toward the detection plate surface by the electric field resulting from the bias voltage applied to the detector, typically several hundred volts positive. The specimen surface is effectively kept at zero volts electrical (ground) potential by the action of mobile charge carriers in the gas. Collisions between the accelerated electrons and gas molecules release additional free electrons which are themselves accelerated toward the detection plate. Under properly controlled conditions of gas pressure and field gradient, the gas-multiplied electron current arriving at the detector plate can be shown to be a linearly amplified function of the secondary signal itself, and used to derive the video signal required for viewing and recording the electron image. The current collected at the detection plate is received by a current amplifier floating at the detector bias voltage and is coupled at full bandwidth to a grounded video circuit.

The dual aperture carrier and secondary electron imaging detector assembly includes a main body, an insulator, and an annular biased-plate detector. The main body includes an upper or first pressure-limiting aperture and a cavity or conduit formed at the end opposite to the upper pressure-limiting aperture. The upper pressure-limiting aperture of the main body receives the electron beam from the optical column liner tube. The lower or second pressure limiting aperture of the aperture carrier is formed integrally with the plate detector. With these two apertures (i.e., the first pressure-limiting aperture and the second pressure-limiting aperture), the objective lens assembly separates the high pressure of the specimen chamber from the vacuum of the optical column liner. Since the electrode coincides with the second pressure-limiting aperture and faces the specimen, the secondary electrons emitted from the specimen may impinge upon it. Such a design allows the current backscatter collectors to operate unhampered, while making use of normal secondary electron emission patterns and any funneling effects thereof.

BRIEF DESCRIPTION OF THE DRAWINGS

The following detailed description, given by way of example but not intended to limit the invention solely to the specific embodiment described, may best be understood in conjunction with the accompanying drawings in which.

DETAILED DESCRIPTION OF THE PREFERRED EMBODIMENT

Figure 1:
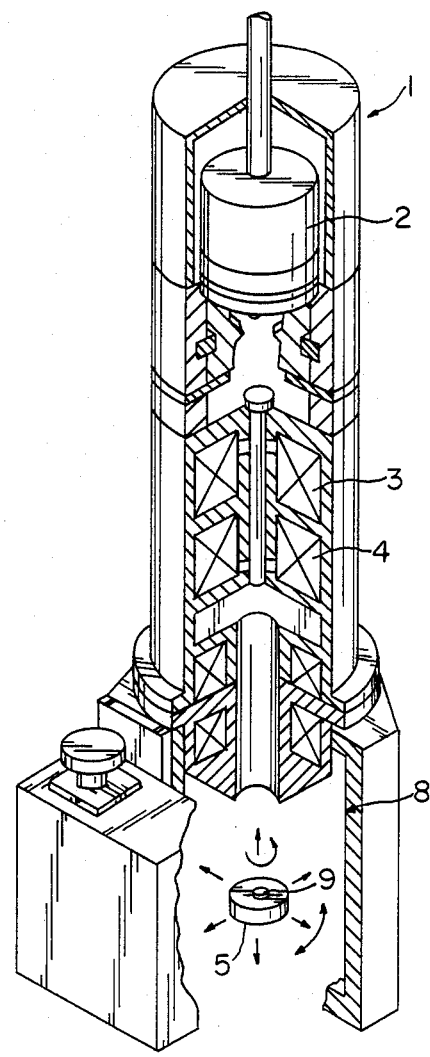
FIG. 1 is a front perspective view of a prior art scanning electron microscope to which this invention may be adapted.

Referring now to FIG. 1, a "standard" scanning electron microscope ("SEM") is illustrated wherein a beam of electrons is emitted through an electron optical column 1 by an electron gun 2. The electron beam passes through magnetic lenses 3 and 4 which are used to focus the beam. The beam is subsequently directed into a specimen chamber 8 wherein it impinges upon a specimen 9 supported upon a specimen stage 5.

Figure 2:
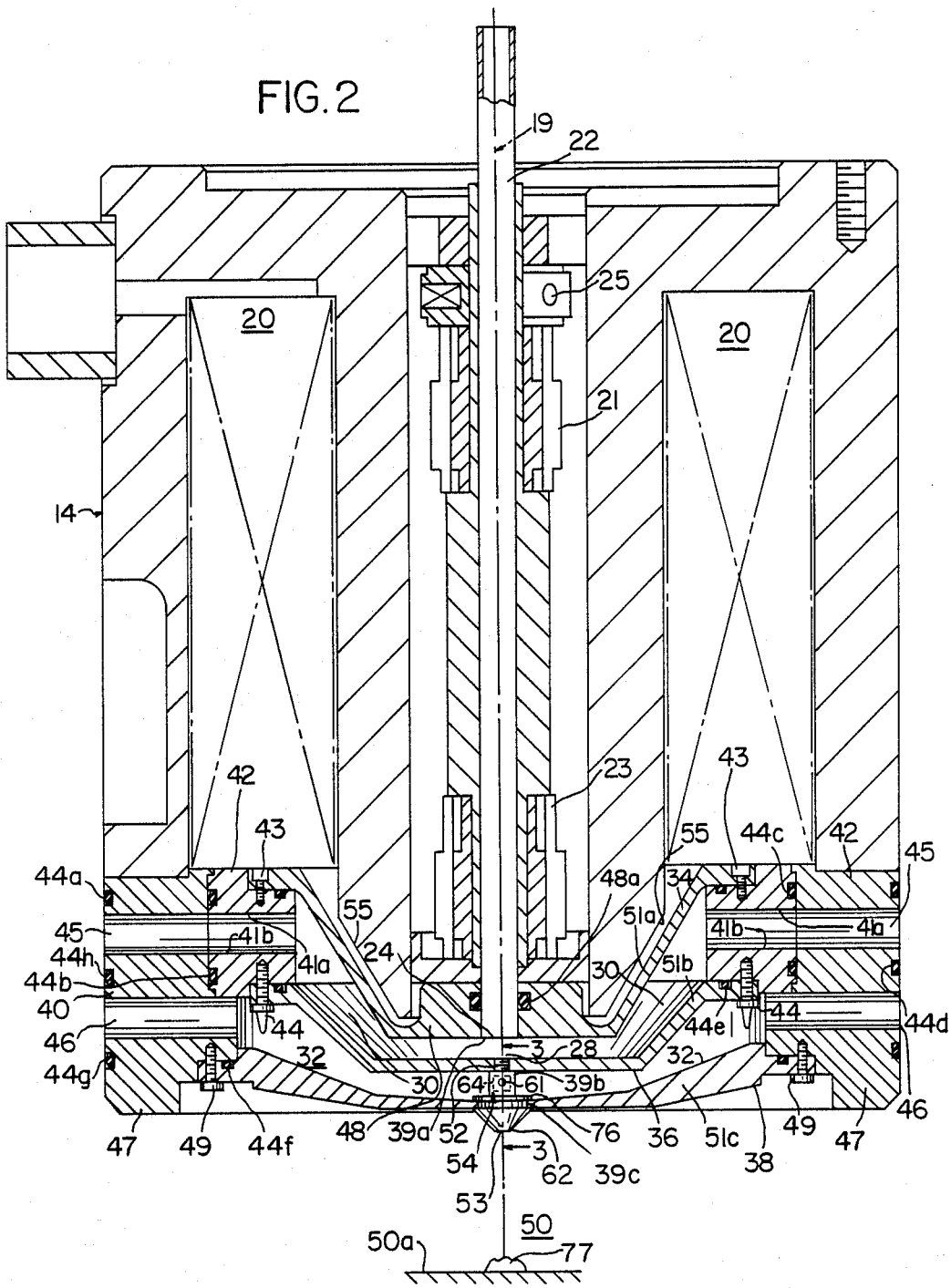
FIG. 2 is a front elevational view of a preferred embodiment of the objective lens assembly used in conjunction with this environmental scanning electron microscope.

A novel objective lens assembly of this invention for an environmental scanning electron microscope ("ESEM") which allows the examination of a specimen in a gaseous environment is shown in FIG. 2. The electron beam emitted by the electron gun passes through the substantially cylindrical objective lens magnetic housing 14 of the ESEM. Housing 14 is preferably made of iron. The electron beam, referred to as "the primary beam", is generally designated by reference numberal 19. It has a tendency to diverge after acceleration; and a lens copper winding 20 disposed within objective lens magnetic housing 14 is used to focus beam 19. The coil surrounds the axially disposed vacuum liner tube 22 which is contained within the objective lens housing 14. An upper and lower scanning coil, 21 and 23, respectively, are radially positioned adjacent to the column liner 22. These scanning coils scan the beam along the length of the column liner 22. A stigmator coil 25 is radially positioned adjacent to the column liner above the upper scanning coil 21. The stigmator coil corrects the beam's shape. The column liner 22 has a column liner discharge opening 24 through which the electron beam is scanned and focused.

The use of small apertures to partition a vacuum system into discrete zones of increasing static pressure while maintaining an unobstructed beam path between them is well known. Usually termed differential pumping, this technique is widely used and is found to some degree in nearly every electron microscope. As is shown in FIG. 2, the objective lens assembly for an ESEM is unique and original in the electron microscopy field in both the implementation of its pressure control system and the pressure levels maintained in the differential pumping zones.

First, as seen in FIG. 2, the beam of electrons passes from the high vacuum of the vacuum column liner 22 into a differentially pumped aperture system 28 which is in communication with the vacuum column liner 22. Differentially pumped aperture system 28 passes through a series of interior passages or "intermediate" vacuum chambers. The beam of electrons passes from a zone of low pressure 30 to a zone of higher pressure 32.

In order to create and separate the zones of different pressure at least two generally annular diaphragms of nonmagnetic material and a magnetic final lens pole piece or diaphragm are attached to the housing at different axial locations and extend inwardly of said housing. These include the nonmagnetic first and second generally annular diaphragms 34 and 36, respectively, and a final annular magnetic lens pole piece 38. Each of the diaphragms has a central opening 39a, 39b, and 39c, respectively, through which the beam of electrons passes. The zone of low pressure or first "intermediate" vacuum chamber 30 is positioned between the first and second generally annular diaphragms 34 and 36. The zone of higher pressure or second "intermediate" vacuum chamber 32 is positioned between the second generally annular diaphragm 36 and the final pole piece 38.

The objective lens assembly also includes means to releasably secure the diaphragms within the housing and seal the zones of pressure. The first or upper nonmagnetic diaphragm 34 is attached and sealed to an upper portion 41a of an upper annular support member or ring 42 formed of magnetic material which abuts an annular magnetic collar 40 positioned inwardly of the housing 14 at one end thereof by fasteners 43. The upper nonmagnetic diaphragm 34 extends inwardly of the upper ring 42. Similarly, the second or lower generally annular nonmagnetic diaphragm 36 is attached and sealed to a lower portion 41b of the upper ring 42 by fasteners 44. The second annular diaphragm 36 also extends inwardly of the upper annular ring 42. The final magnetic pole piece 38 is attached and sealed to a lower annular ring 47 formed of a magnetic material abutting the first ring 42 by fasteners 49. In order to seal the zones of pressure from one another, a plurality of O-rings, such as 44a, b, c, d, e, f, g and h are provided. Thus, with this configuration, the vacuum chambers 30 and 32 are both entirely contained within and sealed against the objective lens magnetic housing 14. However, since the diaphragms are releasably secured within the housing, they may be removed and cleaned easily and efficiently.

The first and second annular diaphragms are preferably made of aluminum and the portion of the vacuum column liner tube adjacent to the liner tube opening 24 is centered and supported within the objective lens housing 14 by an annular central bushing 48 of upper diaphragm 34 which receives the vacuum liner tube 22. An O-ring 48a is provided in the central bushing 48 to further center and support the column liner tube 22 within the housing 14.

By limiting the number of gas molecules within the differentially pumped aperture system 28 and controlling the gas flow between adjacent zones of pressure, the beam of electrons is permitted to pass through the differentially pumped aperture system without being significantly distorted by collisions with gas molecules. A desired level of vacuum is maintained within the housing by means of vacuum pumps (not shown). In order to connect each vacuum chamber or interior passage to its external pumping system, the objective lens magnetic housing 14 has been specially perforated with a number of ports 45 and 46 axially distanced from one another. In order to communicate with the zone of low pressure 30, a plurality of circumferentially disposed radial ports 45 is provided within the upper annular ring 42. Likewise, in order to maintain the pressure within the zone of higher pressure 32, the lower annular ring 47 contains a plurality of circumferentially disposed radial ports 46 which communicate with a corresponding external pumping system.

In order that the magnetic iron housing 14 may extend adjacent to the vacuum column liner tube 22 to properly focus the beam, first diaphragm 34 includes an angularly disposed section 51a which abuts a circumferentially angled section 55 of the iron housing 14. This angled section 55 terminates substantially in alignment with the optical liner opening 24. In order to conform the second annular diaphragm 36 and final pole piece 38 to this cylindrical angular section 51a of the first diaphragm 34, the second diaphragm 36 inclues an angled portion 51b and the final pole piece includes an angled section 51c. As is shown in FIG. 2, the differential pumping system (i.e., the diaphragms, final pole piece, annular rings, and pumping ports) are symmetrical with respect to the central opening of diaphragms of the objective lens housing.

The electron beam 19 passing down the center of the optical column liner traverses the two vacuum chambers 30 and 32 before striking specimen surface 50, which is immersed in the specimen chamber environment 51. The beam passes through two pressure-limiting apertures 52 and 53, both held in alignment within a removable dual aperture carrier and secondary electron detector assembly 54. These two apertures are formed at opposite ends of the aperture carrier 54 and separate the high pressure of the specimen chamber 50 from the vacuum of the column liner 22.

The aperture carrier is located within the central opening of the second diaphragm and final pole piece to permit passage of the electron beam from the vacuum liner tube 22 into the interior passages 30 and 32 and then into the specimen chamber 50 of the ESEM and to limit passage of gas molecules from the specimen chamber into the interior passages. More specifically, the electron beam exits the vacuum liner 22 through the column liner opening 24 located within the central opening 39a of the first diaphragm 34 which is sized to permit passage of an electron beam from the vacuum liner tube into the zone of low pressure or upper interior passage 30. The upper aperture 52 of the aperture carrier 54 is located within central opening 39b of the second annular diaphragm 36 and is sized to permit passage of the electron beam into the lower interior passage or zone of higher pressure 32 and to limit passage of the gas from the lower interior passage to the upper interior passage 30. The lower aperture 53 of the aperture carrier 54 is located substantially in alignment with the central opening 25c of the final pole piece 38 and permits passage of the electron beam into the specimen chamber 50 of the ESEM and limits the passage of gas from the specimen chamber into the lower interior passage 32.

Figure 3:
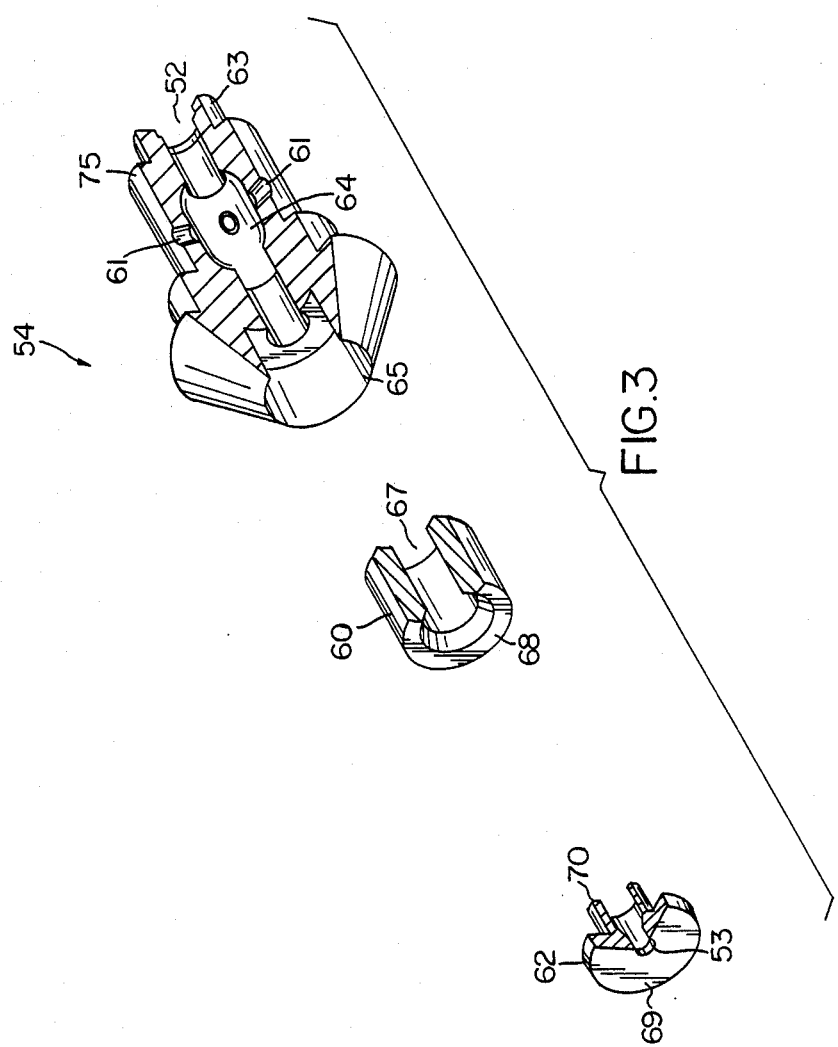
FIG. 3 is a front exploded enlarged view of a preferred embodiment of the dual aperture carrier and secondary electron imaging detector assembly.
Figure 4:
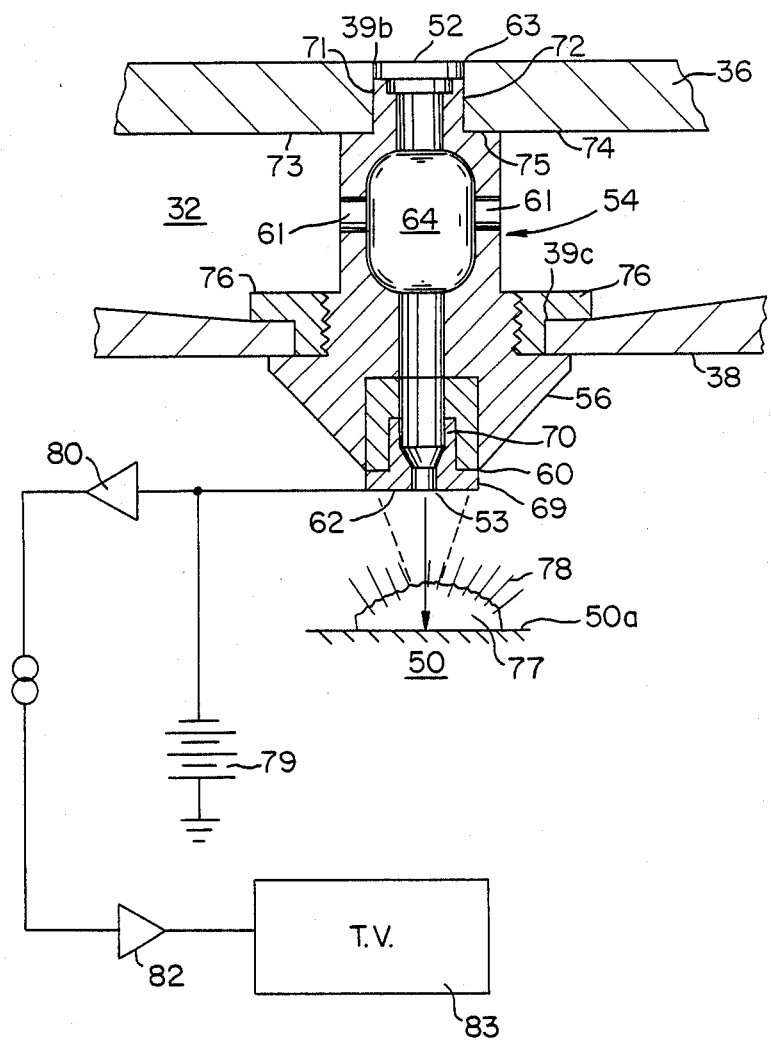
FIG. 4 is a vertical cross-sectional view taken along line 3—3 of FIG. 2.

As is more specifically shown in FIGS. 3 and 4, the dual aperture carrier and secondary electron detection system 54 includes a main body portion 56, an insulator 60 and an annular biased-plate detector 62. The main body includes the first or upper pressure limiting aperture 52 at end 63 and a cavity 64 formed at the upper end below aperture 52. The main body 56 is preferably made of nonmagnetic stainless steel and has a staggered outer surface with multiple recesses. The main body also includes a plurality of orifices 61 which communicate with the zone of higher pressure 32 and is connected to the cavity 64 such that the cavity 64 is maintained approximately at the pressure of the zone of higher pressure 32.

The insulator 60 is formed as a hollow cylinder and has inlet and exit ports 67 and 68, respectively. Insulator 60 is insertably retained within opening 65 of the main body. Insulator 60 is preferably made of delrin, nylon, quartz, or a ceramic. The annular biased plate detector 62 is concentric with the electron beam's axis and includes a base portion 69 and a stem portion 70. The stem portion 70 is received and retained within exit port 68 of insulator 60 and base portion 69 has an opening which defines the lower aperture 53 of the aperture carrier 54. The detector plate is preferably made of stainless steel and the base portion is preferably approximately 0.150 inches in diameter. As a result of this construction, the detector plate and aperture carrier are formed integrally.

As a result of the design of the preferred embodiment, the aperture carrier 54 may be removeably supported within the central openings 39b and 39c such that the apertures 52 and 53 are aligned with the electron beam exiting the optical column liner opening 24. In order to support the aperture carrier within the central opening 39b of the annular diaphragm 36, the generally annular diaphragm 36 has end 71 and 72 which cooperatively support the end 63 of main body 56. Similarly, the base portions 73 and 74 of annular diaphragm 36 are supported on recesses 75 of main body 56. In this manner, aperture 52 is aligned with column liner discharge opening 24 of vacuum column liner 22.

In addition, the entire assembly 54 is threaded into a nonmagnetic bushing 76 (see FIG. 3) preferably made of bronze permanently attached to the objective lens pole piece 38. When fully turned in, the aperture carrier seals both against the pole piece 38 and diaphragm 36 of the differential pumping system, and both pressure-limiting apertures 52 and 53 are simultaneously installed in their proper locations. Upper aperture 52 receives the primary beam from the upper vacuum chamber 30, while lower aperture 53 and detector plate 62 face the specimen under study. The main body of the aperture carrier is relieved with several openings 61 so that the region between the apertures is well exposed to the pressure level of the zone of higher pressure 32. While the upper aperture 52 may be machined directly into the aperture carrier, the outlet aperture must be mounted in the insulating bushing 60 to isolate the biased detector from the grounded lens pole piece.

After the electron beam exits the column liner opening 24, the electron beam travels through zone of low pressure 30 and zone of higher pressure 32. The electron beam travels through zone of low pressure 30 between the column opening 24 and the upper aperture 52 of main body 56 of the aperture carrier 54. The electron beam further travels through zone of higher pressure 32 in the cavity of the main body between apertures 52 and 53 of the aperture carrier 54. As such, the apertures 52 and 53 of the aperture carrier separate the high pressure of the specimen chamber from the vacuum of the vacuum column liner 22.

To obtain better imaging resolution, the detector plate performs as an electrode, permitting secondary electrons emitted from the surface of the sample on specimen stage 50a may impinge upon it. In this configuration, detector plate 62 is formed integrally with aperture 53, thereby maximizing signal collection efficiency and allowing the sample to be positioned at a range of distances (working distances) below the final pressure-limiting aperture. For best resolution, however, it has been found that the specimen should be placed approximately 4 to 10 mm away from final pressure-limiting aperture 53.

The secondary electrons 78 issuing from the specimen 77 are accelerated toward the detection plate surface by the electric field resulting from the biased voltage, typically several hundred volts positive. The specimen surface is effectively kept at zero volts (ground) potential by the action of mobile charge carriers in the gas. Collisions between the accelerated electrons and gas molecules release additional free electrons, which are themselves accelerated toward the detection plate. Under properly controlled conditions of gas pressure and field gradient, the gas-multiplied electron current arriving at the detector plate can be shown to be a linearly amplified function of the secondary signal itself, and used to derive the video signal required for viewing and recording the electron image. The current collected at the detection plate is received by current amplifier 80 floating at the detector biased voltage 79 and must be coupled at full bandwidth to grounded video circuits 82. The video circuits 82 are connected to a display device 83.

Apertures 52 and 53 are made large enough to pass the electron beam, but as small as practical to limit leakage of gas into one chamber from the next one below at higher pressure. In the preferred embodiment, the upper aperture 52 is preferably from 50 to 1000 microns in diameter and the final aperture 53 is preferably from 50 to 1000 microns in diameter.

Each vacuum chamber 30 and 32 is evacuated separately by its own external pumping system capable of handling the gas load of the aperture leak while maintaining the desired pressure. All portions of the differential pumping system located within the lens housing 14 are made of nonmagnetic materials and thus do not affect the formation of the critical magnetic focusing fields.

In contrast to a normal SEM specimen chamber, which must be maintained at a vacuum pressure of 0.0001 Torr or lower, the ESEM of the invention is capable of supporting specimen chamber pressures of over 20 Torr (the saturated partial pressure of water vapor at room temperature) with no significant degradation of vacuum levels in the upper column region. With the addition of a third pressure-limiting aperture (other than apertures 52 and 53) and a third differential pumping stage, the specimen chamber could be held at atmospheric pressure (760 Torr) or even higher.

One important advantage of this configuration is that the integrated differential pumping system causes no loss of electron optical performance due to lengthened working distance (lens-to-specimen distance), as is encountered in below-the-lens pressure control systems. Further, the extremely short working distance made possible by the integration of the imaging detector with the final pressure-limiting aperture 53 assures minimum scattering of the primary beam as it passes through the high pressure specimen chamber region prior to impacting the specimen.

The existence of a secondary electron imaging detector capable of operation at high chamber pressures is important to the use of any electron microscope. Although there has always been a certain amount of debate on the subject, the secondary electron flux resulting from the scanning-beam-specimen interaction is used today to create the vast majority of all SEM images and is widely held to be the carrier of high resolution information. Because of the gaseous atmosphere in the specimen chamber of the ESEM, the traditional Everhart-Thornley imaging detector of the high vacuum SEM cannot be used since the bias voltage of several kilovolts required on the surface of its scintillator would cause electrical breakdown in the gas. However, because of extremely low (picoampere) beam current and signal levels involved in electron microscopy, noise-amplification of the imaging signal similar to that obtainable in the Everhart-Thornley detector's scintillator photomultiplier is strongly desirable from an engineering standpoint.

The image formed with the said integrated aperture-detector device corresponds to the secondary electron signal (SE) only by choosing the correct values of the following parameters: aperture bias, gas pressure and specimen-aperture distance for a given gas or mixture of gases. It has been shown that by choosing a different set of these parameters, it is possible to produce images corresponding to the backscattered electron signal (BSE). Further, by varying the value of these parameters, it is possible to produce images corresponding to a mixture of BSE and SE signals. Because of its multifunction operation, this system has been referred to as a gaseous detector device (GDD) in the ESEM.

It has long been known that under certain conditions of gas pressure and applied electric field, an electron current in the gas can be proportionately increased through successive ionizing impacts with gas molecules, producing a cascade of additional free electrons. The annular biased-plate detector concentric with the beam axis of this invention has been found to offer the highest and most easily controlled gain multiplication of the secondary electron signal. The unification of the detector plate with the final pressure-limiting aperture of the differential pumping system minimizes the size of the detector plate and avoids interference with the bulky back scatter detectors. This is clearly due to its favorable collection geometry and efficient operation at very short working distances. The images produced by the ESEM of the invention are quite similar in quality to those obtained using a typical side mounted Everhart-Thornley detector, with the added advantage that the ideally symmetric coaxial location of the biased plate with respect to the beam produces "shadowless" secondary electron images, an important consideration in some applications. This, coupled with the total dissipation of surface charging (by virtue of mobile ions in the gas environment) permits easy observation of such materials as glass, plastic, and uncoated semiconductor materials without special preparation or grounding.

As such, this electromechanical design satisfies the simultaneous requirements for pressure control, electron beam focusing, and signal amplification, while placing no impractical limitations on specimen handling or microscopic resolving power.

While the invention has been particularly shown and described with reference to a preferred embodiment, it will be readily appreciated by those of ordinary skill in the art that various changes and modifications may be made without departing from the spirit and scope of the invention. For instance, the objective lens assembly may include only one interior passage or "intermediate" vacuum chamber. In this configuration, the interior passage would be positioned between a nonmagnetic annular diaphragm (such as 34) and the final magnetic pole piece (such as 38). The central opening of the nonmagnetic diaphragm defines the diameter of the column liner tube. The aperture carrier (such as 54) would be releasably secured between the central openings of the nonmagnetic diaphragm and the final magnetic pole piece. In accordance with the teachings of the preferred embodiment, the upper aperture of the aperture carrier is then located within the central opening of the nonmagnetic annular diaphragm substantially contiguous with the vacuum liner discharge opening. The lower aperture is then located substantially in alignment with the central opening of the final pole piece. The orifices of the aperture carrier would communicate with the single interior chamber such that the cavity of the aperture carrier is maintained at the pressure of the interior passage. Such a system will not permit the resolution of the specimen which is possible in an environmental scanning microscope having two "intermediate" vacuum chambers but it will provide for better resolution than that achieved by a typical scanning electron microscope.

It is intended that the appended claims be interpreted as including the foregoing as well as various other such changes and modifications.

What is claimed is:

1. An objective lens assembly for an environmental scanning electron microscope comprising:
    (a) a substantially cylindrical objective lens magnetic housing containing an axially disposed vacuum liner tube and containing means for magnetically focusing a beam of electrons passing through said liner tube, said housing having upper and lower pumping ports therein axially distanced from one another;
    (b) at least two annular diaphragms of nonmagnetic material and a final magnetic annular diaphragm attached to said housing at different axial locations and extending inwardly of said housing, said diaphragms defining at least two interior passages, each of which communicate with the said upper and lower pumping ports, respectively; and
    (c) aperture means located within the central opening of said diaphragms to permit passage of said electron beam from said vacuum liner tube into said interior passages and then into the specimen chamber of said environmental scanning electron microscope and to limit passage of gas molecules from the said specimen chamber into the said interior passages.

2. An objective lens assembly as recited in claim 1 wherein the apertures are contained within an aperture carrier releasably mounted and sealed within the central opening of said diaphragms.

3. An objective lens assembly as recited in claim 1 wherein said aperture carrier is threadedly received within the lower part of the objective lens assembly.

4. An objective lens assembly as recited in claim 1 wherein said two interior passages contain gas at different pressures.

5. An objective lens assembly as recited in claim 4 wherein the zone of low pressure is located between the two nonmagnetic annular diaphragms.

6. An objective lens assembly as recited in claim 4 wherein the zone of higher pressure is located between one of the nonmagnetic diaphragms and the final magnetic diaphragm.

7. An objective lens assembly for an environmental scanning electron microscope comprising:
  (a) a substantially cylindrical objective lens magnetic housing containing an axially disposed vacuum liner tube and containing means for magnetically focusing a beam of electrons passing through said liner tube;
  (b) an annular ring comprised of magnetic material abutting said magnetic housing at the lower end thereof and containing at least two ports therein located axially with respect to one another;
  (c) at least two annular diaphragms comprised of nonmagnetic material and a final magnetic annular diaphragm attached to said annular ring at different axial locations and extending inwardly of said ring, said diaphragms defining at least two interior passages, each of which communicates with one of the said ports in said annular ring; and
  (d) aperture means located within the central openings of said diaphragms to permit passage of said electron beam from said vacuum liner tube into said interior passages and then into the specimen chamber of said environmental scanning electron microscope and to limit passage of gas molecules from the said specimen chamber into the said interior passages.

8. An objective lens assembly as recited in claim 7 wherein the apertures are contained within an aperture carrier releasably mounted and sealed within the central openings of said diaphragms.

9. An objective lens assembly as recited in claim 7 wherein said aperture carrier is threadedly received within the lower part of the objective lens assembly.

10. An objective lens assembly for an environmental scanning microscope comprising:
  (a) a substantially cylindrical objective lens magnetic housing containing an axially disposed vacuum liner tube and containing means for magnetically focusing a beam of electrons passing through said liner tube;
  (b) an annular ring comprised of magnetic material abutting said magnetic housing at the lower end thereof and containing at least two ports therein located axially with respect to one another;
  (c) at least two annular diaphragms comprised of nonmagnetic material and a final magnetic annular diaphragm attached to said annular ring at different axial locations and extending inwardly of said ring, said diaphragms defining at least two interior passages, each of which communicates with one of the said ports in said annular ring; and
  (d) a combination aperture holder and electron detector releasably received and sealed within the central openings of the said annular diaphragms, said aperture holder having apertures therein for passage of the electron beam and gas into and out of the specimen chamber of the environmental scanning electron microscope and the said interior passages and having electron detector means associated with the lower portion thereof, said detector means being insulated from the body of said aperture holder.

11. An objective lens assembly for an environmental scanning electron microscope comprising:
  (a) a substantially cylindrical objective lens magnetic housing containing an axially disposed vacuum liner tube and containing means for magnetically focusing the beam of electrons passing through said liner tube;
  (b) an upper annular ring comprised of magnetic material abutting said magnetic housing at one end thereof and a lower ring comprised of magnetic material abutting said first ring, each of said rings having a plurality of circumferentially disposed ports therein;
    (i) an annular upper diaphragm comprised of nonmagnetic material attached and sealed to an upper portion of said upper ring and extending inwardly thereof, said upper diaphragm having a central bushing which receives said vacuum liner,
    (ii) an annular intermediate diaphragm comprised of nonmagnetic material attached and sealed to a lower portion of said upper ring and extending inwardly thereof, and
    (iii) an annular lower diaphragm comprised of magnetic material attached and sealed to said lower ring and extending inwardly thereof and comprising the final pole piece of said objective lens assembly,
  said upper and intermediate diaphragms defining an upper interior passage which communicates at its periphery with the plurality of ports in said upper ring and said intermediate and lower diaphragms defining a lower interior passage which communicates at its periphery with the plurality of ports in said lower ring; and
  (c) (i) upper aperture means located within the central opening of said upper diaphragm sized to permit passage of an electron beam from said vacuum liner tube into said upper interior passage,
    (ii) intermediate aperture means located within the central opening of said intermediate diaphragm sized to permit passage of said electron beam into said lower interior passage and to limit passage of gas from said lower interior passage to said upper interior passage, and
    (iii) lower aperture means located within the central opening of said lower diaphragm sized to permit passage of said electron beam into the specimen chamber of said environmental scanning microscope and to limit the passage of gas from the said specimen chamber into said lower interior passage.

12. An objective lens assembly as recited in claim 11 wherein said intermediate and lower aperture means are contained within an aperture carrier which is releasably received and sealed within the said central openings of said intermediate and lower diaphragms.

13. An objective lens assembly as recited in claim 12 wherein the said aperture carrier is threadedly received within the annular lower diaphragm.

14. An objective lens assembly as recited in claim 11 wherein the intermediate aperture means is from 50 to 1000 microns in diameter.

15. An objective lens assembly as recited in claim 11 wherein the lower aperture means is from 50 to 1000 microns in diameter.

16. A combination objective lens assembly and aperture holder for use in an environmental electron scanning microscope comprising:
   (a) a substantially cylindrical objective lens magnetic housing containing an axially disposed vacuum liner tube and containing means for magnetically focusing a beam of electrons passing through said liner tube;
   (b) an annular ring comprised of magnetic material abutting said magnetic housing at the lower end thereof and containing at least two ports therein located axially with respect to one another;
   (c) at least two annular diaphragms comprised of nonmagnetic material and a final annular magnetic diaphragm attached to said annular ring at different axial locations and extending inwardly of said ring, said diaphragms defining at least two interior passages, each of which communicates with one of the said ports in said annular ring; and
   (d) a combination aperture holder and electron detector releasably sealed within the central openings of said final annular pole piece and one of said diaphragms comprised of:
      (i) a main body having a conduit therein, said main body being adapted to be releasably received and sealed within a recess in said objective lens assembly;
      (ii) a lower aperture in the lower end of said conduit sized to permit an electron beam to pass through and to limit the passage of gas from the specimen chamber of the said environmental scanning electron microscope to the zone above said lower aperture;
      (iii) a port in said main body above the said lower aperture, said port providing communication from said conduit into a lower interior passage in said objective lens assembly; and
      (iv) a higher aperture within said conduit positioned above said lower aperture and above the said port therein, said upper aperture being sized to permit an electron beam to pass therethrough and to limit the passage of gas from the conduit to a higher passage within said objective lens assembly.

17. A combination objective lens assembly, aperture holder and detector for use in an environmental electron scanning microscope comprising:
   (a) a substantially cylindrical objective lens magnetic housing containing an axially disposed vacuum liner tube and containing means for magnetically focusing the beam of electrons passing through said liner tube;
   (b) an upper annular ring comprised of magnetic material abutting said magnetic housing at one end thereof and a lower ring comprised of magnetic material abutting said first ring, each of said rings having a plurality of circumferentially disposed ports therein;
      (i) an annular upper diaphragm comprised of nonmagnetic material attached and sealed to an upper portion of said upper ring and extending inwardly thereof, said upper diaphragm having a central bushing which receives said vacuum liner,
      (ii) an annular intermediate diaphragm comprised of nonmagnetic material attached and sealed to a lower portion of said upper ring and extending inwardly thereof, and
      (iii) an annular lower diaphragm comprised of a magnetic material attached and sealed to said lower ring and extending inwardly thereof and comprising the final pole piece of said objective lens assembly, said upper and intermediate diaphragms defining an upper interior passage which communicates at its periphery with the plurality of ports in said upper ring and said intermediate and lower diaphragms defining a lower interior passage which communicates at its periphery with the plurality of ports in said lower ring; and
   (c) a combination aperture holder and electron detector releasable sealed within the central openings of said annular lower and intermediate diaphragms and comprised of:
      (i) a main body having a conduit therein, said main body being adapted to be releasably received and sealed within a recess in said objective lens assembly;
      (ii) a lower aperture in the lower end of said conduit sized to permit an electron beam to pass through and to limit the passage of gas from the specimen chamber of the said environmental scanning electron microscope to the zone above said lower aperture;
      (iii) a port in said main body above the said lower aperture, said port providing communication from said conduit into a lower interior passage in said objective lens assembly;
      (iv) a higher aperture within said conduit positioned above said lower aperture and above the said port therein, said upper aperture being sized to permit an electron beam to pass therethrough and to limit the passage of gas from: the conduit to an upper interior passage within said objective lens assembly; and
      (v) an electron detector located at the lower end of said main body and separated therefrom by insulating means.

18. An improved environmental scanning electron microscope comprising:
   (a) means for generating and directing an electron beam toward a specimen;
   (b) a combination objective lens assembly and aperture holder comprising:
      (i) a substantially cylindrical objective lens magnetic housing containing an axially disposed vacuum liner tube and containing means for magnetically focusing a beam of electrons passing through said liner tube;
      (ii) an annular ring comprised of magnetic material abutting said magnetic housing at the lower end thereof and containing at least two ports therein located axially with respect to one another;

(iii) at least two annular diaphragms comprised of nonmagnetic material and a final magnetic diaphragm attached to said annular ring at different axial locations and extending inwardly of said ring, said diaphragms defining at least two interior passages, each of which communicates with one of the said ports in said annular ring; and (iv) a combination aperture holder and electron detector releasably sealed within the central openings of said magnetic diaphragm and one of said nonmagnetic diaphragms and comprised of:

a main body having a conduit therein, releasably received and sealed within a recess in said objective lens assembly; a lower aperture in the lower end of said conduit sized to permit an electron beam to pass through and to limit the passage of gas from the specimen chamber of the said environmental scanning electron microscope to the zone above said lower aperture;

a port in said main body above the said lower aperture, said port providing communication from said conduit into a lower interior passage in said objective lens assembly;

a higher aperture within said conduit positioned above said lower aperture and above the said port therein, said upper aperture being sized to permit an electron beam to pass therethrough and to limit the passage of gas from the conduit to a higher passage within said objective lens assembly;

(c) a specimen chamber positioned below said objective lens, which maintains the specimen enveloped in gas in registration with the lower aperture such that a surface of the specimen may be exposed to the focused beam of electrons;

(d) a specimen mount located within the specimen chamber and positioned for supporting the specimen so as to allow the focused beam of electrons to interact with the specimen; and (e) electron detection means positioned to detect electrons resulting from said interaction.

19. An improved environment scanning electron microscope as recited in claim 18 further comprising means for recording information detected by said detector.

20. An improved environment scanning electron microscope as recited in claim 19 wherein said recording means includes a current amplifier receiving the current collected at the detection means, said current amplifier floating at the detector bias voltage and coupled at full bandwidth to grounded video circuits.

21. An objective lens assembly for an environmental scanning electron microscope comprising:

(a) a substantially cylindrical objective lens magnetic housing containing an axially disposed vacuum liner tube and containing means for magnetically focusing a beam of electrons passing through said liner tube, said housing having a pumping port therein;

(b) an annular diaphragm of nonmagnetic material and a final magnetic annular diaphragm attached to said housing at different axial locations and extending inwardly of said housing, said diaphragms defining an interior passage which communicates with said pumping port; and (c) aperture means located within the central opening of said diaphragms to permit passage of said electron beam from said vacuum liner tube into said interior passage and then into the specimen chamber of said environmental scanning microscope and to limit passage of gas molecules from the said specimen chamber into the said interior passage.

22. An objective lens assembly for an environmental scanning electron microscope comprising:

(a) a substantially cylindrical objective lens magnetic housing containing an axially disposed vacuum liner tube and containing means for magnetically focusing a beam of electrons passing through said liner tube;

(b) an annular ring comprised of magnetic material abutting said magnetic housing at the lower end thereof and containing a pumping port;

(c) an annular diaphragm of nonmagnetic material and a final magnetic annular diaphragm attached to said housing at different axial locations and extending inwardly of said housing, said diaphragms defining an interior passage which communicates with said pumping port; and (d) a combination aperture holder and electron detector releasably received and sealed within the central openings of said diaphragms, said aperture holder having apertures therein for passage of the electron beam and gas into and out of the specimen chamber of the environmental scanning electron microscope and the said interior passage and having electron detector means associated with the lower portion thereof, said detector means being insulated from the body of said aperture holder.

23. An objective lens assembly for an environmental electron microscope comprising:

(a) a substantially cylindrical objective lens magnetic housing containing an axially disposed vacuum liner tube and containing means for magnetically focusing a beam of electrons passing through said liner tube, said housing having upper and lower pumping parts therein axially distanced from one another; and (b) at least one annular diaphragm of nonmagnetic material and a final magnetic annular diaphragm attached to said housing at different axial locations and extending inwardly of said housing, said diaphragms defining at least two interior passage, each of which communicates with the said upper and lower pumping ports, respectively.

* * * * *